United States Patent [19]
Liu

[11] Patent Number: 5,679,607
[45] Date of Patent: Oct. 21, 1997

[54] METHOD OF MANUFACTURING A DAMAGE FREE BURIED CONTACT USING SALICIDE TECHNOLOGY

[75] Inventor: Ming-Hsi Liu, Chung-Li City, Taiwan

[73] Assignee: Winbond Electronics Corp., Hsinchu, Taiwan

[21] Appl. No.: 514,171

[22] Filed: Aug. 11, 1995

[51] Int. Cl.$^6$ .................................................. H01L 21/28
[52] U.S. Cl. ........................... 437/200; 437/192; 437/193
[58] Field of Search ................................ 457/26, 191, 192, 457/193, 200, 228

[56] References Cited

U.S. PATENT DOCUMENTS

| | | | |
|---|---|---|---|
| 5,053,349 | 10/1991 | Matsuoka | 437/200 |
| 5,064,776 | 11/1991 | Roberts . | |
| 5,126,285 | 6/1992 | Kosa et al. . | |
| 5,162,259 | 11/1992 | Kolar et al. . | |
| 5,348,896 | 9/1994 | Jang et al. . | |
| 5,536,683 | 7/1996 | Lin et al. | 437/200 |

OTHER PUBLICATIONS

"Limitation of Spacer Thickness in Titanium Salicide ULSI CMOS Technology", Janmye James Sung and Chih-Yuan Lu, IEEE Electron Device Letters, vol. 10, No. 11, Nov. 1989, pp. 481–483.

*Primary Examiner*—John Niebling
*Assistant Examiner*—Thomas G. Bilodern
*Attorney, Agent, or Firm*—Meltzer, Lippe, Goldstein, et al.

[57] ABSTRACT

A manufacturing process for a CMOS cell with a buried contact uses highly selective etching techniques in combination with a thin oxide etching stop to prevent damage to the buried contact during the etching process. A cavity is formed in the oxide layer between the buried contact and its adjacent interconnect polysilicon element. A self-aligning silicide process (salicide) is used to coat the interconnect polysilicon, the cavity, and the buried contact, to form a continuous electrical connection between the interconnect polysilicon and the buried contact.

12 Claims, 8 Drawing Sheets

METHOD OF MANUFACTURING A DAMAGE FREE BURIED CONTACT USING SALICIDE TECHNOLOGY

FIELD OF THE INVENTION

The present invention relates to semiconductor IC manufacture. In particular, the present invention relates to electrically connecting a semiconductor substrate to a region formed thereon.

BACKGROUND OF THE INVENTION

Buried contact regions within CMOS memory cells have been extensively used for connecting polysilicon elements to silicon substrate elements. The following references discuss either buried contact regions or connections thereto:

1. O. D. Trapp, L. J. Lopp & R. A. Blanchard, "Semiconductor Technology Handbook", Technology Associates, Portola Valley, Calif., 1994
2. Janmye James Sung & Chin-Yuan Lu, "Limitation of Spacer Thickness in Titanium Salicide VLSI CMOS technology", IEEE Electron Device Letters, Vol. 10, No. 11, Nov., 1989
3. U.S. Pat. No. 5,064,776, by Roberts, "Method of Forming Buried Contact Between Polysilicon Gate and Diffusion Area"
4. U.S. Pat. No. 5,126,285, by Kosa et al., "Method for Forming a Buried Contact"
5. U.S. Pat. No. 5,348,896, by Lee, "Buried Contact Process"
6. U.S. Pat. No. 5,162,259, by Kolar et al. "Method for Forming a Buried Contact in a Semiconductor Device."

During the manufacturing process, however, etching of the polysilicon can damage the silicon substrate elements, since both the polysilicon and the substrate contain silicon. To illustrate this type of problem, a representative example of the prior art technology for buried contact cell manufacture is shown in FIGS. 1a through 1k.

Figure 1A:
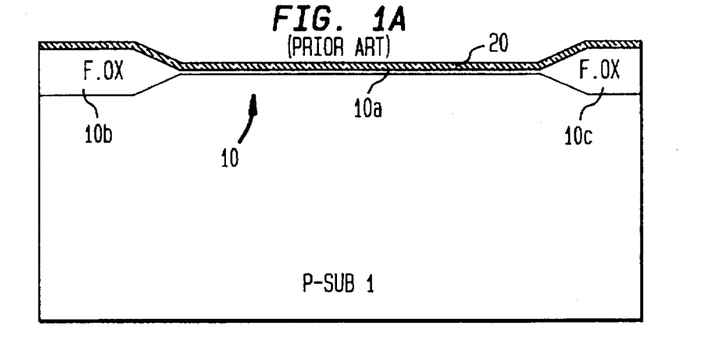
FIGS. 1a through 1k illustrate a prior art method of manufacturing a buried contact in a semiconductor cell.

In FIG. 1a, an oxide layer 10 is formed on a p-type silicon substrate 1. Field oxide (F.ox) regions 10b and 10c are grown on the substrate 1 surface. A thin gate oxide layer 10a is then grown on the substrate 1 surface, between F.ox regions 10b and 10c. A thin polysilicon layer 20 is then deposited on the oxide layer 10 to protect the oxide layer from contamination.

Figure 1B:
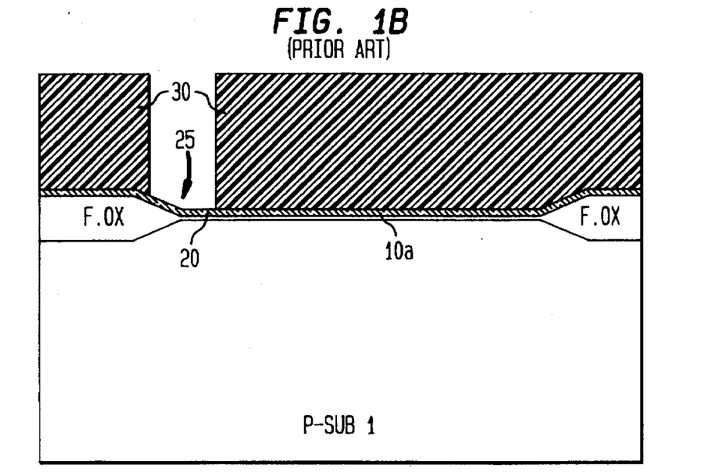

In FIG. 1b, a photoresist mask 30 is formed on the polysilicon layer 20. The photoresist mask 30 is formed using a photolithographic process so as to expose a window 25 of the polysilicon layer 20 surface.

Figure 1C:
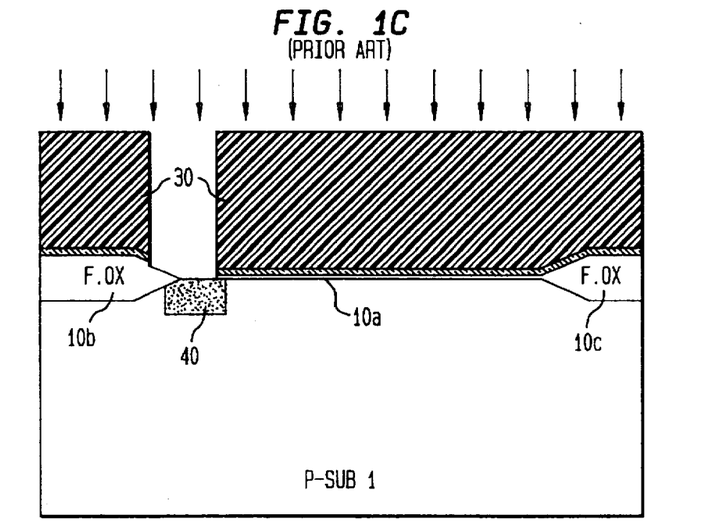

In FIG. 1c, anisotropic (dry) etching is used first to remove the polysilicon and the thin oxide from the buried contact window surface 20. As shown in FIG. 1c, the field oxide 10b suffers a small loss in thickness as a result of the etching process. Subsequent to the etching process, a buried contact N$^+$ region 40 is formed by ion implantation.

Figure 1D:
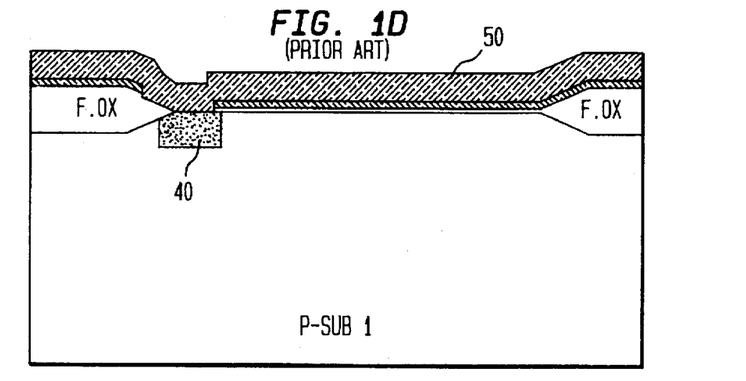

In FIG. 1d, photoresist mask 30 is removed and a thick layer of polysilicon 50 is deposited on the surface. Using an expansion process technique, the polysilicon layer 50 is then doped with phosphorous oxychloride (POCL$_3$) to reduce its resistance.

Figure 1E:
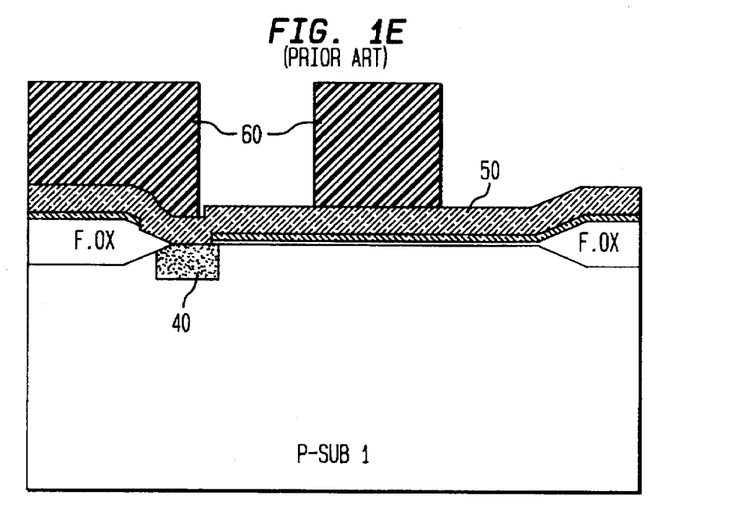

In FIG. 1e, a photoresist mask 60 is formed to define a polysilicon pattern.

Figure 1F:
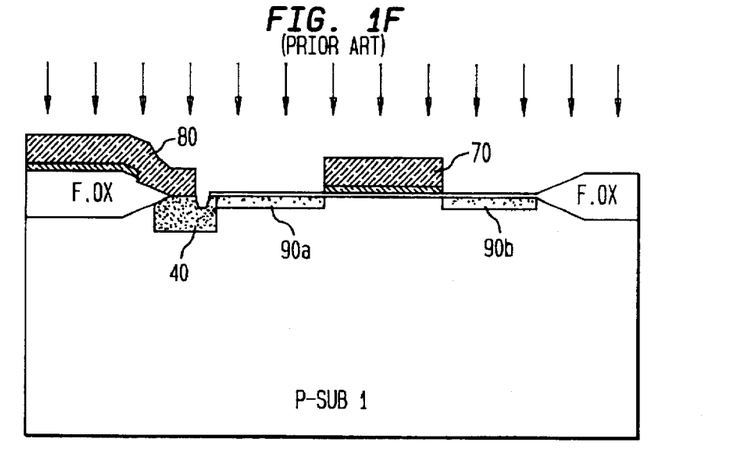

In FIG. 1f, anisotropic etching is used to remove the regions of polysilicon layer 50 not covered by the mask 60, forming a gate region 70 and an interconnect region 80. Illustratively, an electrocoating etching process is used. Due to the similarity in etching selectivity of the polysilicon and the silicon substrate, etching damage occurs in the substrate. This type of damage is indicated by the "trench" in FIG. 1f.

Subsequent to the etching process, photoresist mask 60 is removed, and NMOS lightly doped drain (NLDD) ion implantation is used to form N regions 90a,90b in substrate 1. This reduces the hot carrier effect in the channel below the gate 70.

Figure 1G:
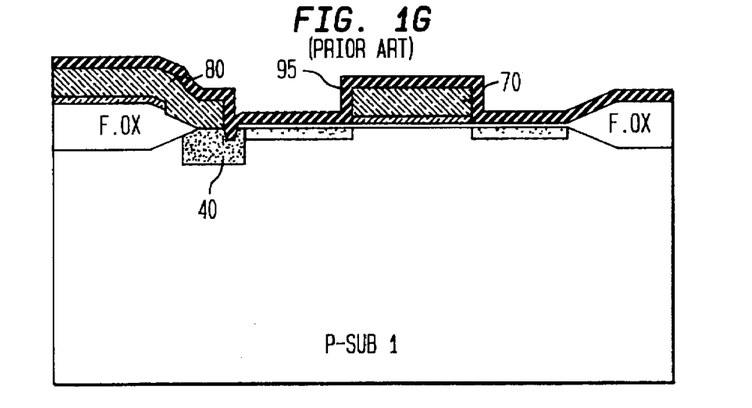

In FIG. 1g, a layer of undoped silicon dioxide (SiO$_2$) 95 is deposited on all exposed surface areas.

Figure 1H:
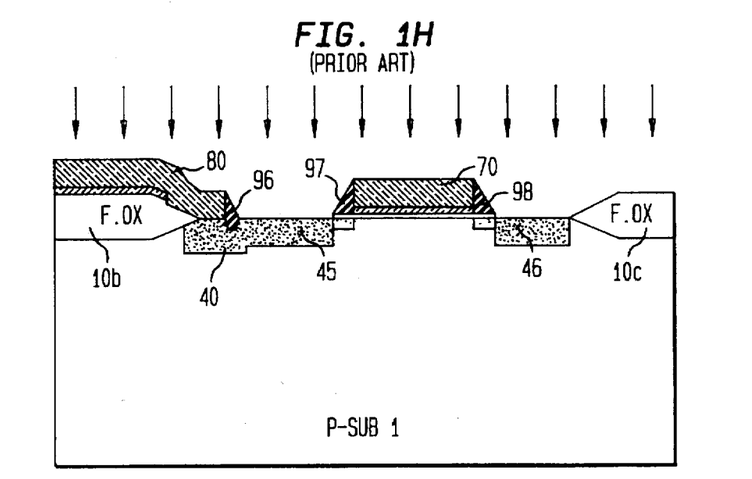

In FIG. 1h, anisotropic etching is used first on the undoped silicon dioxide 95. This process limits the etching depth such that residues of undoped SiO$_2$ 96,97,98 remain on the vertical edges of the polysilicon regions 80,70, to act as spacers. However, the undoped SiO$_2$ residue 96 also fills in the trench shown in FIG. 1f. Subsequently, ion implantation is used to form N$^+$ regions 45,46 in substrate 1, which are bounded by the polysilicon, the undoped SiO$_2$ spacers (80 and 96; 70 and 97,98) and the field oxide regions 10b,10c.

Figure 1I:
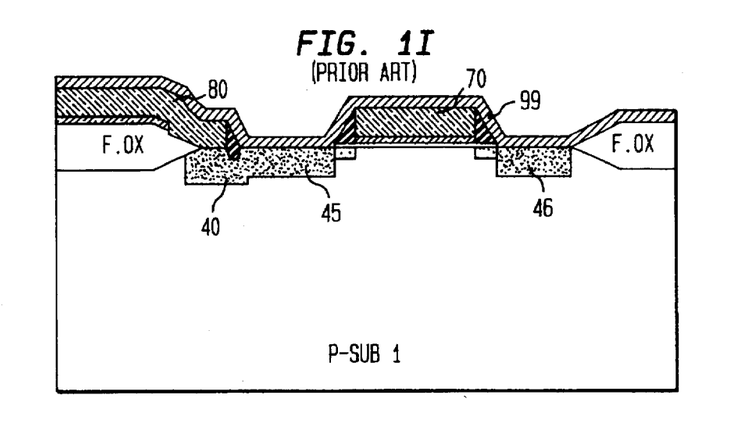

In FIG. 1i, a thin layer of titanium 99 is deposited on all exposed surface areas.

Figure 1J:
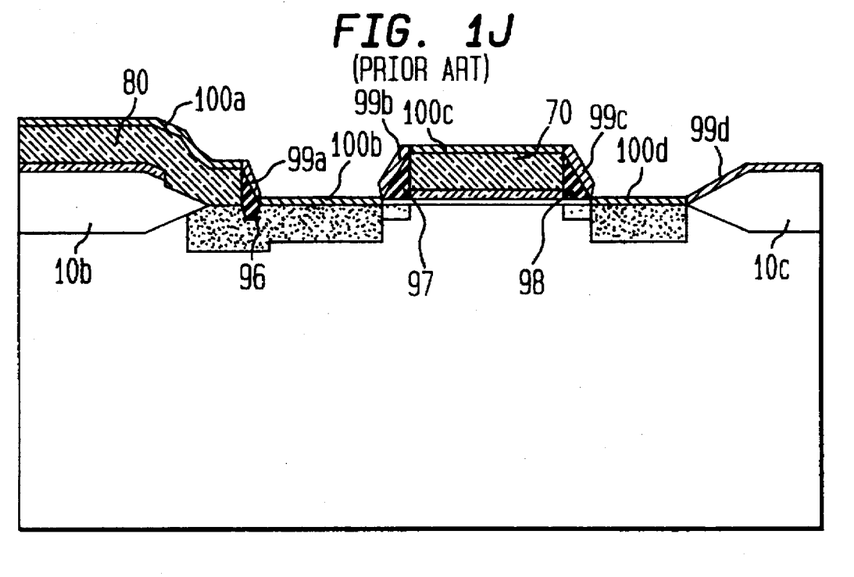

In FIG. 1j, a rapid thermal annealing (RTA) process in N$_2$ (nitrogen) ambient is used to cause the titanium 99 and polysilicon 70,80 and titanium 99 and silicon substrate 1, to react with each other to form titanium silicide (TiSi$_2$) regions 100a,100c on the polysilicon 80,70 and TiSi$_2$ regions 100b,100d on the substrate 1 surfaces. The titanium 99 does not react, however, with the undoped SiO$_2$ spacers 96,97,98 or with the field oxide 10c. In fact, during the rapid thermal annealing (RTA) process the N$_2$ (nitrogen) is used to cause the titanium and N$_2$ (nitrogen) to react with each other to form TiN$_x$. That is to say, when using the rapid thermal annealing (RTA) process in N$_2$ (nitrogen) ambient, the resultant structure, originating from Ti/SiO$_2$ (Ti/field oxide & Ti/undoped SiO$_2$ spacers) film, is TiN$_x$/Ti/SiO$_2$ and the resultant structure, originating from Ti/Si (Ti/polysilicon & Ti/Si-substrate) film, is TiN$_x$/Ti/TiSi$_2$.

Figure 1K:
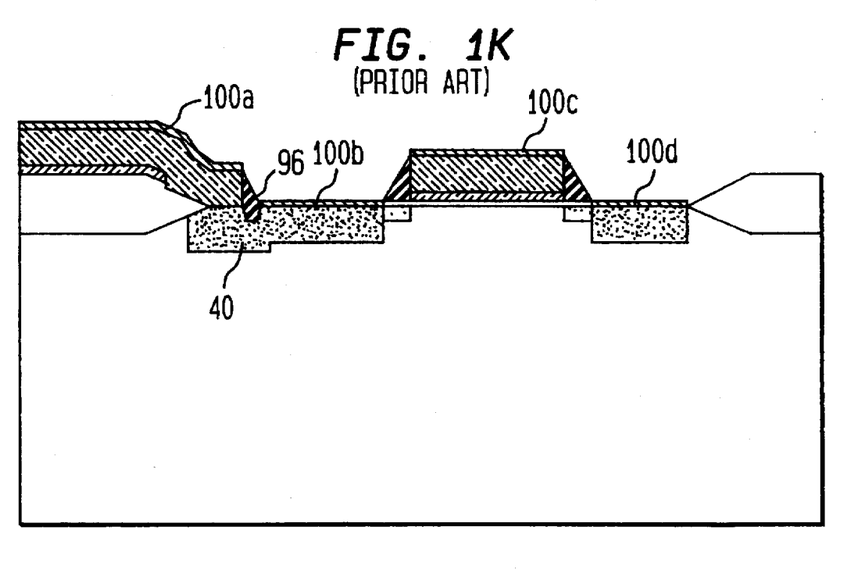

In FIG. 1k, the TiN$_x$ and unreacted Ti regions 99a, 99b, 99c, 99d above the field oxide, undoped SiO$_2$ spacers, polysilicon and silicon substrate, are first etched away. Then the titanium silicide regions 100a, 100b, 100c, 100d are converted by a rapid thermal process (RTP) from a C49 (C49 TiSi$_2$) structure with a resistance value of 60–80 µΩcm to a C54 (C54 TiSi$_2$) with a resistance value of 16–20 µΩcm. Due to the self-aligning feature of the silicide formation, this method is referred to as "salicide" (self-align silicide) technology.

In the above described prior art, there is a trench in the N$^+$ buried contact 40, as shown in FIG. 1f, which becomes filled with undoped SiO$_2$ 96, as shown in FIGS. 1g and 1h. This type of trench is susceptible to junction leakage, which is a distinct disadvantage of the prior art. It is an object of the present invention, therefore, to protect against the formation of such trenches by avoiding damage to the substrate during the polysilicon etching process. It is a further object of the present invention to provide a high conductivity, continuous electrical connection between the buried contact region and the polysilicon region.

SUMMARY OF THE INVENTION

According to one embodiment of the inventive method, the aforementioned objectives are achieved by the following procedure.

An oxide layer is disposed on a substrate surface. A polysilicon region is then formed on the oxide layer, using an anisotropic etching agent specifically selected to avoid damage to the oxide layer.

Isotropic etching is then used to form a cavity in the oxide layer between a portion of the polysilicon region and the substrate. A buried contact region is formed within the substrate, such that a portion of the buried contact region extends beneath the cavity underlying a portion of the polysilicon region.

A metal layer (e.g., titanium) is deposited on the polysilicon region, within the cavity, and on the buried contact region. The metal layer is then reacted with the polysilicon region and the buried contact region, including the cavity, to form a silicide coating (e.g., titanium silicide). The silicide coating provides a continuous electrical connection between the polysilicon region, the cavity, and the buried contact region.

Finally, the structure of the silicide is converted so as to reduce its resistance. The present invention will be more clearly understood from the following description of a preferred embodiment thereof, when taken in conjunction with the following drawings.

DETAILED DESCRIPTION OF THE INVENTION

Figure 2:
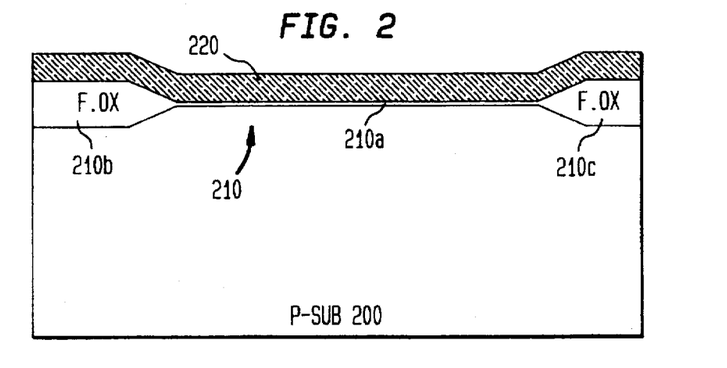
FIGS. 2 through 13 illustrate the inventive method of manufacturing a damage free buried contact in a semiconductor cell.

Referring now to FIG. 2, in accordance with one embodiment, a p-type silicon substrate 200 is covered by an oxide layer 210 which has field oxide (F.ox) regions 210b, 210c at either end, and a gate (thin oxide) layer 210a between the F.ox regions 210b,210c. The F.ox regions 210b,210c range in thickness from about 3,000 to 10,000 Å, and provide cell isolation. The gate oxide layer 210a ranges in thickness from about 70 to 300 Å, and functions as the gate dielectric. Illustratively, the F.ox regions 210b,210c may be formed by the Local Oxidation of Silicon (LOCOS) process, which is well known in the art.

A layer of polysilicon 220 is deposited on the oxide layer 210 by chemical vapor deposition (CVD) to a thickness in the range of about 1,500 to 5,000 Å. The polysilicon layer 220 is then doped with phosphorous oxychloride (POCL$_3$), in a temperature range of about 800° to 1,000° C., to reduce the resistance of the polysilicon 220. Illustratively, the polysilicon layer 220 is doped to an impurity concentration of about $10^{19}$–$10^{21}$ cm$^{-3}$.

Figure 3:
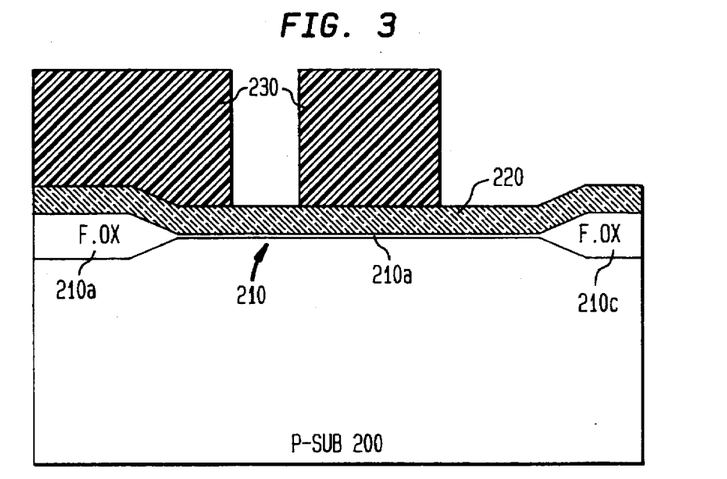

In FIG. 3, a photoresist mask 230 is formed on the polysilicon layer 220 to define the interconnect and gate electrode regions of polysilicon 220.

Figure 4:
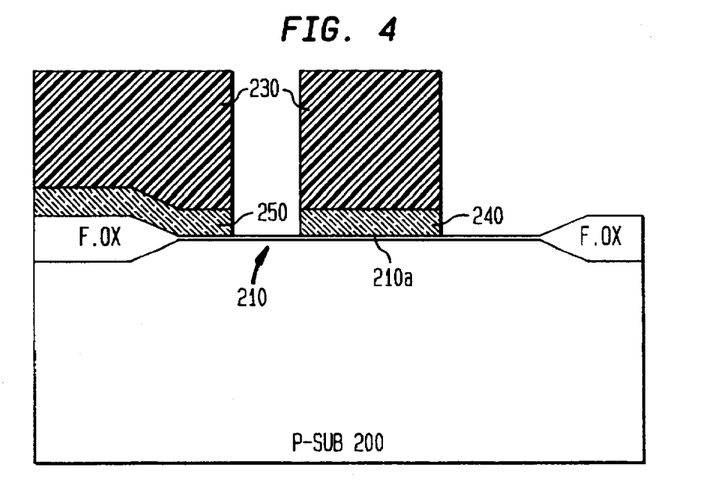

In FIG. 4, the uncovered regions of polysilicon 220 are etched away, leaving a gate region 240 and an interconnect region 250 disposed on oxide layer 210. Anisotropic (dry) etching is used, with an etching gas of high selectivity, such as Hydrogen Bromide (HBr/Cl$_2$/O$_2$). That is, the etching rate is very high for silicon, but very low for oxide. As a result, the thin oxide layer 210a acts as an etching stop, protecting the substrate 200 from damage during the polysilicon 220 etching process. Illustratively, the gate region has a width of approximately 0.25–0.80 μm.

Figure 5:
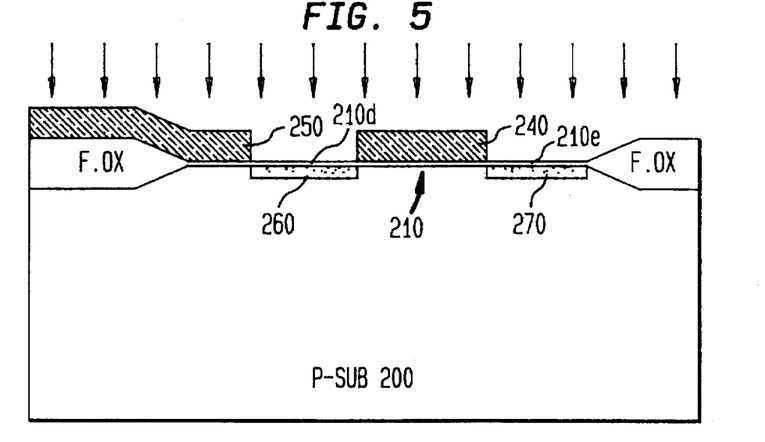

In FIG. 5, photoresist 230 is removed, and NLDD (NMOS lightly-doped drain) ion implantation is performed, to implant N regions 260,270 in the substrate 200 below the exposed thin oxide surfaces 210d,210e. Illustratively, arsenic ions or phosphorus ions may be used, with an energy of about 20–70 kev and a dosage of about $10^{13}$ to $6\times10^{13}$ ions/cm$^2$. The N regions 260, 270, illustratively have a width of approximately 0.25–0.8 μm a depth of approximately 0.05–0.5 μm and a doping concentration of about $10^{17}$–$10^{19}$ cm$^{-3}$.

Figure 6:
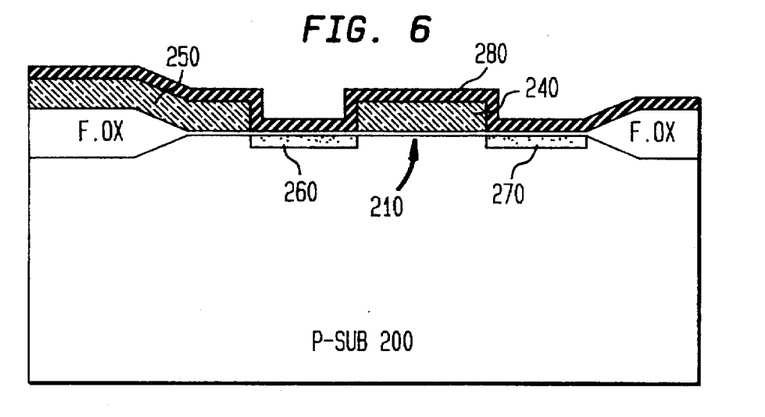

In FIG. 6, a layer of undoped silicon dioxide (SiO$_2$) 280 is deposited on the entire surface to a thickness in the range of about 800 to 3,000 Å by CVD (chemical vapor deposition). Illustratively, the reacting gas may be SiH$_2$Cl$_2$/N$_2$O, SiH$_4$/O$_2$, or TEOS/O$_2$, at a temperature in the range of about 400°–800° C.

Figure 7:
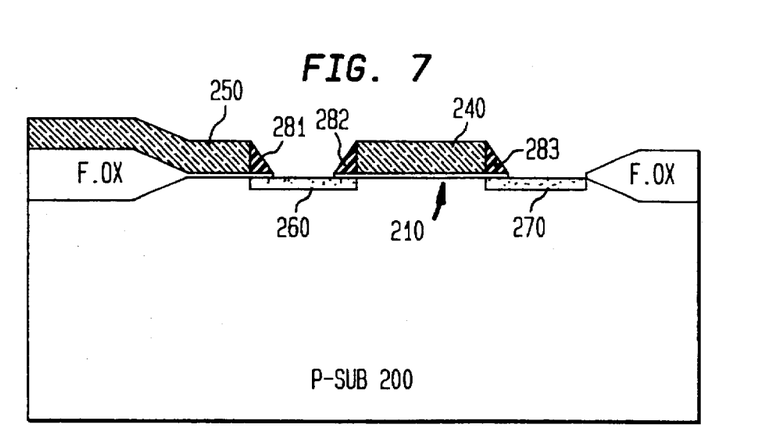

In FIG. 7, using an electrocoating process, the undoped SiO$_2$ layer 280 and the exposed thin oxide regions 210d, 210e are etched with a highly selective etching gas. In this step, the etching gas must have a high rate of etching for oxide, and a low rate of etching for silicon. Illustratively, the etching gas may be CHF$_3$/CF$_4$. Since the etching depth can be controlled by this process, residual amounts of undoped SiO$_2$ 280 are retained on the vertical edges of the polysilicon regions 250,240. These residual undoped SiO$_2$ deposits 281,282,283 act as spacers.

Figure 8:
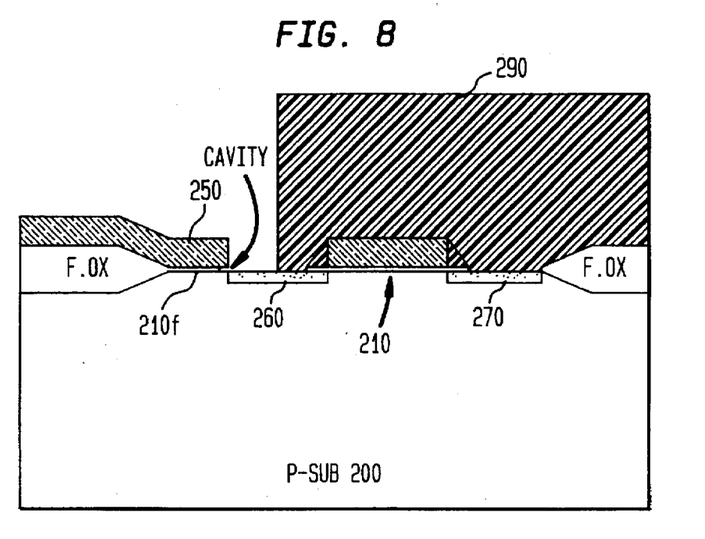

In FIG. 8, a photoresist mask 290 is positioned over the substrate surface areas except for the interconnect polysilicon region 250 and a portion of the N region 260 adjacent to the interconnect polysilicon region 250. Isotropic (wet) etching of the thin oxide 210f beneath the interconnect polysilicon 250 is then performed to create a cavity under a portion of the interconnect polysilicon 250 adjacent to the exposed portion of N region 260. Illustratively, an HF-based solution or an HF-based solution plus buffering agents, such as NH$_4$F, may be used in the etching process. The cavity illustratively has a width of approximately 0.05–0.3 μm.

Figure 9:
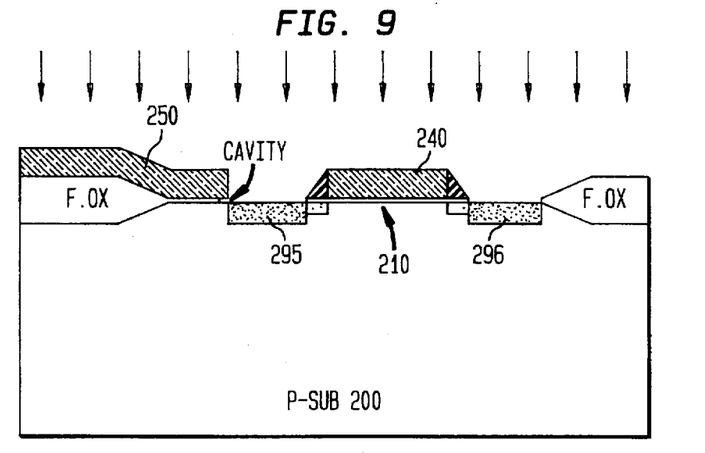

In FIG. 9, photoresist mask 290 is removed, and ion implantation is performed to implant N$^+$ regions 295,296 in the substrate 200 beneath the exposed substrate 200 surface areas. Illustratively, As ions may be used with an energy of about 5–100 kev, and a dosage of about $10^{15}$ to $8\times10^{15}$ ions/cm$^2$, or P ions may be used with an energy of about 5–90 kev, and a dosage of about $10^{15}$ to $8*10^{15}$ ions/cm$^2$. This forms N$^+$ regions 295, 296 having a depth of approximately 0.05–0.5 μm, a width of approximately 0.25–0.8 μm, and a doping concentration of about $10^{20}$–$10^{21}$ cm$^{-3}$.

Figure 10:
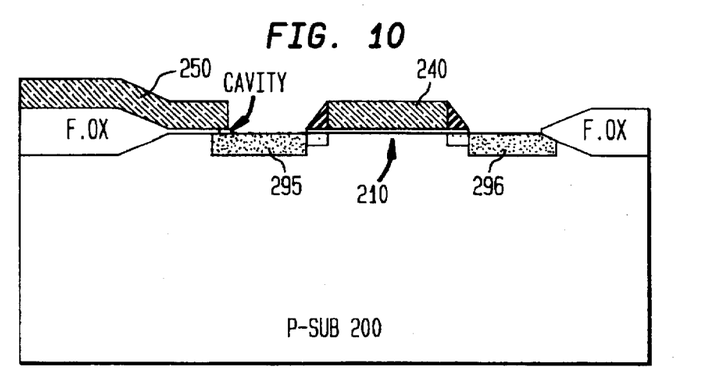

In FIG. 10, a thermal cycle process is used to cause the implanted N$^+$ regions 295,296 to diffuse laterally. Illustratively, the substrate is heated for a duration of about 10–120 minutes at a temperature of about 800°–1000° C. Importantly, the N$^+$ region 295 adjacent to the interconnect polysilicon region 250 diffuses under the cavity area separating the interconnect polysilicon 250 and the substrate 200 surface.

Figure 11:
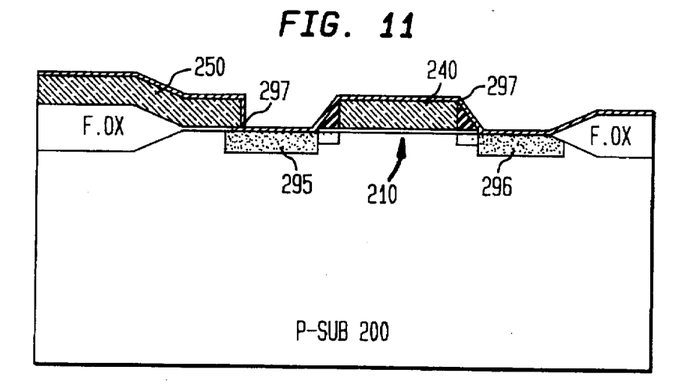

In FIG. 11, a layer of titanium 297 is deposited on the entire surface to a thickness in the range of about 300 to 1,800 Å by CVD. Importantly, the titanium layer 297 also fills in the cavity between the interconnect polysilicon 250 and the adjacent N$^+$ buried contact region 295.

Figure 12:
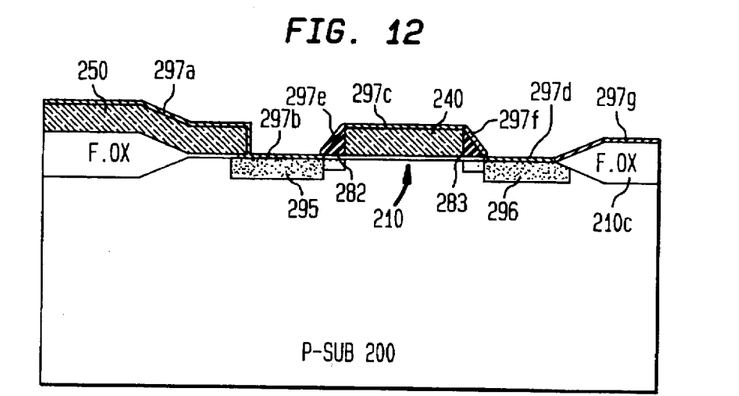

In FIG. 12, a thermal annealing (RTA) process in N$_2$ ambient is used to cause the titanium layer 297 to react with the polysilicon 250,240 and with the silicon substrate 200. The RTA process forms titanium silicide (TiSi$_2$) regions 297a,297b,297c,297d on the polysilicon 250,240 and substrate 200 surfaces. Illustratively, the RTA process is performed in an atmosphere of N$_2$, at a temperature range of about 500°–1000° C. for about 10–60 seconds. However, titanium silicide does not form on the oxide spacer 282,283 surfaces or on the F.ox 210c surface. Rather, when using the rapid thermal annealing (RTA) process in $N_2$ (nitrogen) ambient, the resultant structure, originating from Ti/SiO$_2$ (Ti/field oxide and Ti/undoped SiO$_2$ spacers) film, is TiN$_x$/Ti/SiO$_2$ and the resultant structure, originating from Ti/Si (Ti/polysilicon & Ti/Si-substrate) film, is TiN$_x$/Ti/TiSi$_2$.

Figure 13:
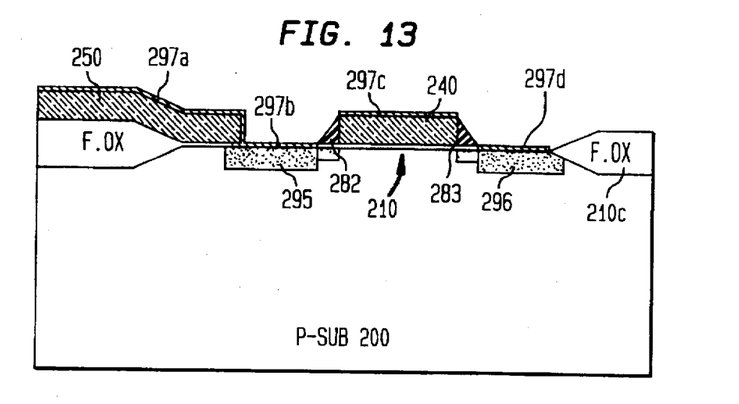

In FIG. 13, the unreacted Ti and TiN$_x$ regions 297e, 297f, 297g on the surface of the wafer are etched away using a solution such as a $H_2SO_4$ based solution or a $NH_4OH$ based solution. Finally, a rapid thermal process (RTP) is used to convert the silicide regions 297a–d from C49 TiSi$_2$ with a resistance value of 60–80 μΩcm to C54 TiSi$_2$ with a resistance value of 16–20 μΩcm. The RTP process is performed in $N_2$ ambient at a temperature of about 700°–1100° C. for about 10–50 seconds.

Note that the preferred embodiment has been described in regard to a wafer with a P-type substrate. However, the invention also applies equally to an N-type substrate. In an N-type substrate, the buried contact should be fabricated in a P-well.

Thus, the above described inventive method provides a technique for manufacturing a buried contact semiconductor cell which avoids damage to the silicon substrate during the polysilicon etching process. A further advantage of the present invention is the formation of a high conductivity, continuous electrical connection between the buried contact, the cavity, and the polysilicon interconnect.

One embodiment of the inventive method has been described above. Numerous other embodiments may be devised by those having ordinary skill in the art without departing from the spirit and scope of the following claims.

The claimed invention is:

1. A method of manufacturing a semiconductor cell with at least one buried contact, comprising the steps of:
   a) forming an oxide layer on a substrate,
   b) forming a polysilicon region on said oxide layer,
   c) etching a cavity in said oxide layer between a portion of said polysilicon region and said substrate,
   d) forming a buried contact region within said substrate, such that a portion of said buried contact region underlies said cavity,
   e) forming a continuous metal layer on said polysilicon region, within said cavity, and on said buried contact region.

2. The method of claim 1 wherein said step (e) further comprises:
   reacting said metal layer with said polysilicon and buried contact region to form a silicide layer.

3. The method of claim 1 wherein said oxide layer has a thickness range of 70 to 300 Å.

4. The method of claim 1 wherein said polysilicon region has a thickness range of 1,500 to 5,000 Å.

5. The method of claim 1 wherein said step (b) further comprises the step of:
   doping said polysilicon region with phosphorous oxychloride to reduce the resistance of said polysilicon region.

6. The method of claim 1 wherein said step (b) further comprises the step of:
   anisotropically etching said polysilicon region without etching said oxide layer.

7. The method of claim 1 wherein said step (c) further comprises the step of:
   isotropically etching said oxide layer with an HF-based solution.

8. The method of claim 1 wherein said step (d) further comprises the step of:
   implanting ions into said substrate with an energy in the range of 5–100 kev, and a dosage in the range of $10^{15}$ to $8 \times 10^{15}$ ions/cm$^2$.

9. The method of claim 8 wherein said ions are chosen from the group consisting of arsenic and phosphorus ions.

10. The method of claim 1 wherein said step (e) further comprises the step of:
    forming said metal layer with a thickness in the range of 300 to 1,800 Å.

11. The method of claim 2 wherein step (e) further comprises:
    using rapid thermal annealing with a temperature range of 500°–1000° C. and $N_2$ gas.

12. The method of claim 2 wherein said silicide layer is converted from C49 TiSi$_2$ with a resistance value of 60–80 μΩcm to C54 TiSi$_2$ with a resistance value of 16–20 μΩcm.

* * * * *